(12) United States Patent
Kim et al.

(10) Patent No.: US 9,490,379 B2
(45) Date of Patent: Nov. 8, 2016

(54) THIN FILM SOLAR CELLS AND METHOD OF MANUFACTURING THE SAME

(75) Inventors: Mincheol Kim, Icheon-si (KR); Haeyeol Kim, Paju-si (KR); Seongkee Park, Goyang-si (KR); Jungshik Lim, Seoul (KR); Miji Lee, Suncheon-si (KR)

(73) Assignee: LG DISPLAY CO., LTD., Seoul (KR)

( * ) Notice: Subject to any disclaimer, the term of this patent is extended or adjusted under 35 U.S.C. 154(b) by 771 days.

(21) Appl. No.: 12/974,794

(22) Filed: Dec. 21, 2010

(65) Prior Publication Data

US 2012/0042940 A1 Feb. 23, 2012

(30) Foreign Application Priority Data

Aug. 17, 2010 (KR) .................. 10-2010-0079268

(51) Int. Cl.
| | | |
|---|---|---|
| *H01L 31/0236* | (2006.01) | |
| *H01L 31/0224* | (2006.01) | |
| *H01L 31/0392* | (2006.01) | |
| *H01L 31/046* | (2014.01) | |

(52) U.S. Cl.
CPC . *H01L 31/02366* (2013.01); *H01L 31/022466* (2013.01); *H01L 31/0392* (2013.01); *H01L 31/046* (2014.12); *Y02E 10/50* (2013.01)

(58) Field of Classification Search
CPC .................. H01L 31/02168; H01L 31/02366

USPC ................................................. 136/252, 256
See application file for complete search history.

(56) References Cited

U.S. PATENT DOCUMENTS

| 6,355,353 | B1* | 3/2002 | Hyodo et al. ................ 428/432 |
|---|---|---|---|
| 6,420,647 | B1* | 7/2002 | Ji et al. ......................... 136/259 |
| 2007/0120141 | A1* | 5/2007 | Moustakas et al. .......... 257/103 |
| 2009/0039361 | A1 | 2/2009 | Li et al. |
| 2009/0090412 | A1* | 4/2009 | Calwer et al. ................ 136/259 |
| 2009/0320910 | A1* | 12/2009 | Matsui et al. ................ 136/252 |

FOREIGN PATENT DOCUMENTS

CN 201051502 4/2008

OTHER PUBLICATIONS

Nguyen, Pho, Hou T. Ng, Jing Kong, Alan M. Cassell, Richard Quinn, Jun Li, Jie Han, Melanie McNeil, and M. Meyyappan. "Epitaxial Directional Growth of Indium-doped Tin Oxide Nanowire Arrays." Nanoletters 3.7 (2003): 925-28.*

* cited by examiner

*Primary Examiner* — Keith Hendricks
*Assistant Examiner* — Kourtney S Carlson
(74) *Attorney, Agent, or Firm* — Dentons US LLP

(57) ABSTRACT

A thin film solar cell comprises a substrate, an inorganic layer disposed on the substrate and having a plurality of unevenness, a first electrode disposed on the inorganic layer and having a plurality of second unevenness, an absorbing layer disposed on the first electrode, and a second electrode disposed on the absorbing layer.

5 Claims, 11 Drawing Sheets

THIN FILM SOLAR CELLS AND METHOD OF MANUFACTURING THE SAME

This application claims the benefit of Korea Patent Application No. 10-2010-0079268 filed on Aug. 17, 2010, the entire contents of which is incorporated herein by reference for all purposes as if fully set forth herein.

BACKGROUND

1. Field

This document relates to a thin film solar cell and a method of manufacturing the same.

2. Related Art

A variety of studies on alternative energy sources of existing fossil fuels have progressed in order to solve the energy problems. Particularly, the studies focus on the use of natural energy sources such as wind energy, atom energy, and solar energy so as to replace petroleum energy source which is expected to be depleted within several tens of years.

Among the alternative energy sources, solar cells have been particularly spotlighted because, as cells for generating electric energy from solar energy, the solar cells are able to draw energy from an abundant source, and do not cause environmental pollution. The solar cell employing monocrystalline bulk silicon which is being put into practical use has not been greatly widespread due to its high manufacturing and installment costs.

A study on a thin film solar cell for solving such cost problems is being vigorously made, and particularly, a thin film solar cell using amorphous silicon (a-Si:H) has attracted great attention as a technique enabling large-sized solar cells to be manufactured at a low cost. The thin film solar cell may have a configuration where a first electrode, an absorbing layer, and a second electrode are sequentially formed on a first substrate, and, for improvement of efficiency, a texturing process is performed so as to form large unevenness on a surface of the first electrode. This texturing process is performed by a chemical etching method using an acid-base solution. However, The texturing process has a problem in that a shape of the unevenness is not freely adjusted and the resistance is increased due to damage of the surface of the first electrode.

SUMMARY

Embodiments of this document provide a thin film solar cell and a manufacturing method thereof, capable of improving electrical characteristics of the thin film solar cell.

According to an exemplary embodiment of this document, there is provided a thin film solar cell comprising a substrate; an inorganic layer disposed on the substrate and having a plurality of unevenness; a first electrode disposed on the inorganic layer and having a plurality of second unevenness; an absorbing layer disposed on the first electrode; and a second electrode disposed on the absorbing layer.

According to an exemplary embodiment of this document, there is provided a method of manufacturing a thin film solar cell, comprising, forming an inorganic layer on a substrate; etching the inorganic layer to form a plurality of first unevenness; forming a first electrode on the inorganic layer to form a plurality of second unevenness on a surface of the first electrode; forming an absorbing layer on the first electrode; and forming a second electrode on the absorbing layer.

According to another embodiment of this document, there is provided a thin film solar cell comprising a substrate having a plurality of first unevenness; an inorganic layer disposed on the substrate and having a plurality of second unevenness; a first electrode disposed on the inorganic layer and having a plurality of third unevenness; an absorbing layer disposed on the first electrode; and a second electrode disposed on the absorbing layer.

According to another embodiment of this document, there is provided a method of manufacturing a thin film solar cell, comprising etching a surface of a substrate to form a plurality of first unevenness; forming an inorganic layer on the substrate to form a plurality of second unevenness on a surface of the inorganic layer; forming a first electrode on the inorganic layer to form a plurality of third unevenness on a surface of the first electrode; forming an absorbing layer on the first electrode; and forming a second electrode on the absorbing layer.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION

Figure 1:
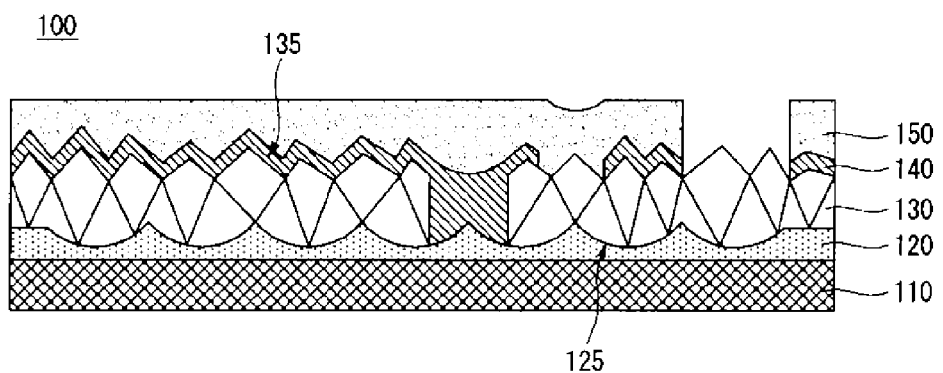
FIG. 1 is a diagram illustrating a thin film solar cell according to a first embodiment of this document.

Hereinafter, embodiments of this document will be described in detail with reference to the accompanying drawings. Like reference numerals designate like elements throughout the specification. In the following description, when a detailed description of well-known functions or configurations related to this document is determined to unnecessarily cloud a gist of the present invention, the detailed description thereof will be omitted.

FIG. 1 is a diagram illustrating a thin film solar cell according to a first embodiment of this document.

Referring to FIG. 1, the thin film solar cell 100 comprises a substrate 110, an inorganic layer 120 which is disposed on the substrate 110 and has a plurality of first unevenness 125, a first electrode 130 which is disposed on the inorganic layer 120 and has a plurality of second unevenness 135, an absorbing layer 140 disposed on the first electrode 130, and a second electrode 150 disposed on the absorbing layer 140.

The substrate 110 may employ glass or transparent resin film. The glass may be plate glass having, as main compositions, silicon oxide ($SiO_2$), sodium oxide ($Na_2O$), and calcium oxide (CaO) with high transparency and insulating property.

The inorganic layer 120 is an insulating layer having a plurality of first unevenness 125 and may be made of silicon nitride (SiNx). The inorganic layer 120 is disposed on the substrate 110 and may play a part to cause a plurality of second unevenness 135 to be formed on the first electrode 130 disposed on the inorganic layer 120.

A sectional shape of the first unevenness 125 may be a hemisphere as shown in the figure. The first unevenness 125 facilitates the formation of the second unevenness 135 due to a self-textured step of the first electrode 130 when the first electrode 130 is deposited later. However, the sectional shape of the first unevenness 125 is not limited to the hemisphere but may be a polygon of a triangle or more.

In addition, the inorganic layer 120 may have the thickness of 3000 to 6000Å. Here, if the thickness of the inorganic layer 120 is 3000Å or more, it is possible to easily form the first unevenness 125 by etching the inorganic layer 120 and to prevent damage of the underlying substrate 110. Also, if the thickness of the inorganic layer 120 is 6000 or less, it is possible to reduce a time taken to deposit the inorganic layer 120 and to prevent increase in the thickness of the thin film solar cell.

The first electrode 130 may be made of transparent conductive oxide or metal. The transparent conductive oxide may use any one selected from the group constituted by zinc oxide (ZnO), tin oxide (SnO), cadmium oxide ($Cd_2O_3$), and indium tin oxide (ITO), and particularly may use the indium tin oxide (ITO). The metal may use silver (Ag) or aluminum (Al).

The first electrode 130 may be formed of a single layer made of the transparent conductive oxide or the metal, but not limited thereto, it may be formed of multiple layers of double layers of the transparent conductive oxide and the metal, or more.

A surface of the first electrode 130 has a plurality of second unevenness 135. The second unevenness 135 increases the surface area of the first electrode 130 and thus has an advantage in that scattering of incident light is generated to lengthen the path of the light.

The absorbing layer 140 may be made of amorphous silicon, CdTe, or CIGS ($CuInGaSe_2$) and have a pin structure. Here, in the case where the absorbing layer 140 is made of amorphous silicon as an example, the pin structure may be formed of p+ amorphous silicon layer/i (intrinsic) amorphous silicon layer/n+ amorphous silicon layer.

Here, if light is incident on the pin structure, the silicon thin film layer absorbs the light to generate pairs of electrons and holes. The generated electrons and holes respectively move towards the p type semiconductor and the n type semiconductor due to the built-in potential which is generated by the p type and the n type in the pin structure.

In this embodiment, the absorbing layer 140 is shown as a single layer, but the absorbing layer 140 may be formed of p+ amorphous silicon layer/i (intrinsic) silicon layer/n+ amorphous silicon layer.

The second electrode 150 may be made of the transparent conductive oxide or the metal like the first electrode 130. The transparent conductive oxide may use indium tin oxide (ITO), tin oxide ($SnO_2$), or zinc oxide (ZnO), and particularly may use the indium tin oxide (ITO). The metal may use silver (Ag) or aluminum (Al).

The second electrode 150 may be formed of a single layer made of the transparent conductive oxide or the metal, but not limited thereto, it may be formed of multiple layers of double layers of the transparent conductive oxide and the metal, or more.

Figure 2:
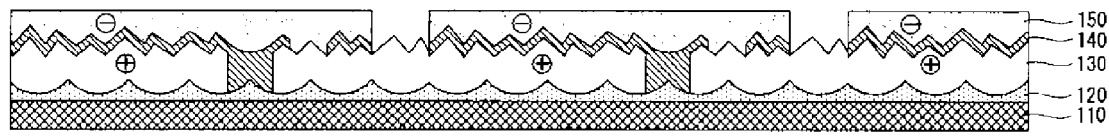
FIG. 2 is a diagram illustrating cells connected in series in the thin film solar cell shown in FIG. 1.

The thin film solar cell 100 according to an embodiment of this document includes a plurality of cells, and each of the cells has a structure as shown in FIG. 1. FIG. 2 shows an example where the first electrode 130 is applied with a positive voltage (+) and the second electrode 150 is applied with a negative voltage (−). The cells are connected in series. For example, the second electrode 150 of the first cell is connected to the first electrode 130 of the second cell, and the second electrode 150 of the second cell is connected to the first electrode 130 of the third cell. The absorbing layer 140 and the second electrode 150 are removed between the respective cells. In order to insulate the neighboring cells, a portion of the first electrode 130 is removed between the neighboring cells, and the absorbing layer 140 is present in the removed part.

Hereinafter, a method of manufacturing the thin film solar cell according to the first embodiment of this document will be described.

FIGS. 3A to 3D are diagrams illustrating a method of manufacturing the thin film solar cell according to the first embodiment of this document, in an order of processes. In the following, the description overlapped with the above description will be omitted.

Figure 3A:
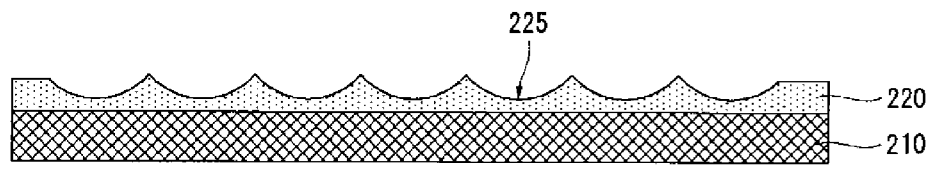
FIGS. 3A to 3D are diagrams illustrating a method of manufacturing the thin film solar cell according to the first embodiment of this document, in an order of processes.

In FIG. 3A, first, an inorganic layer 220 is deposited on a substrate 210. As described above, the inorganic layer 220 may be formed by depositing silicon nitride (SiNx) using the chemical vapor deposition (CVD). At this time, the inorganic layer 220 has the thickness of 3000 to 6000Å.

Thereafter, a surface of the inorganic layer 220 formed on the substrate 210 is etched to form a plurality of first unevenness 225. Here, the first unevenness 225 may be formed using a wet etching or a dry etching. At this time, the depth of the first unevenness 225 is adjusted so as not to damage the substrate 210 disposed under the inorganic layer 220.

Figure 3B:
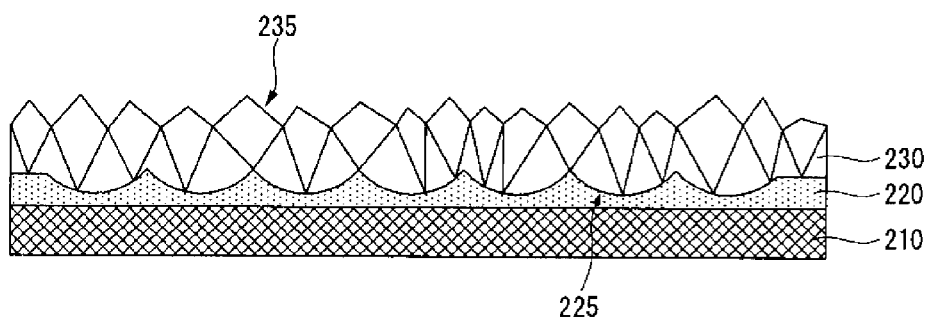

Next, in FIG. 3B, a first electrode 230 is formed on the substrate 210 provided with the first unevenness 225.

Specifically, if a transparent conductive material, for example, ITO is deposited on the inorganic layer 220 using a sputtering method, the crystallinity of the ITO is improved due to the underlying first unevenness 225 and undergoes the self-textured step during the deposition. Here, surface of inorganic layer 220 is unevenly protruded while inorganic material is crystallized from seeds existed on first unevenness 225. Therefore, the second unevenness 235 is formed on the surface of the first electrode 230 resulting from the self-textured step of the first electrode 230.

The second unevenness 235 may have an irregularly protruding shape, and the height of each of the second unevenness 235 may be a random height.

Figure 3C:
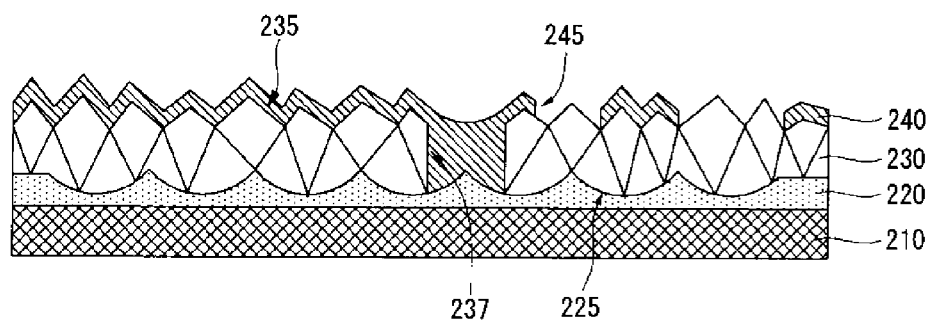

In FIG. 3C, the first electrode 230 is patterned. At this time, the first electrode 230 may be patterned using a photoresist method, a sandblast method, a laser scribing method, or the like. Here, the first electrode 230 may be divided by a first patterned line 237.

Next, an absorbing layer 240 is formed on the first electrode 230 where the patterning is completed. The absorbing layer 240 may be deposited using a plasma enhanced chemical vapor deposition (PECVD).

Subsequently, the absorbing layer 240 is patterned. At this time, the absorbing layer 240 in a region where the first electrode 230 is spaced apart from the first patterned line 237 is patterned. Here, the absorbing layer 240 may be patterned using the photoresist method, the sandblast method, the laser scribing method, or the like. Thus, the absorbing layer 240 may be divided by a second patterned line 245.

Figure 3D:
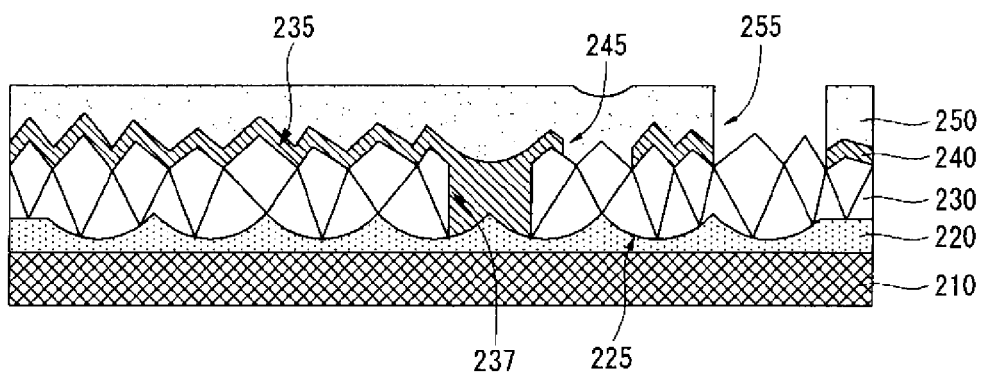

Next, in FIG. 3D, a second electrode 250 is formed on the substrate 210 provided with the absorbing layer 240 where the patterning is completed.

The second electrode 250 may be made of a material which is the same as the material of the first electrode 230. For electrical insulation, the absorbing layer 240 and the second electrode 250 formed on the substrate 210 are patterned.

At this time, a region spaced apart from the above-described first patterned line 237 and second patterned line 245 is patterned, which may be thus electrically insulated by a third patterned line 255.

As described above, the thin film solar cell according to the first embodiment of this document can be manufactured.

As such, there is an advantage in that since the inorganic layer having a plurality of first unevenness is formed, a plurality of second unevenness can be formed on the surface of the first electrode deposited on the inorganic layer. Therefore, this can replace the process where the unevenness is formed on the first electrode using the acid-base solution in the related art.

Thereby, there is advantageous in that it is possible to easily form the unevenness on the surface of the first electrode and to prevent deterioration in the electrical characteristics due to the damage of the surface of the first electrode.

Figure 4:
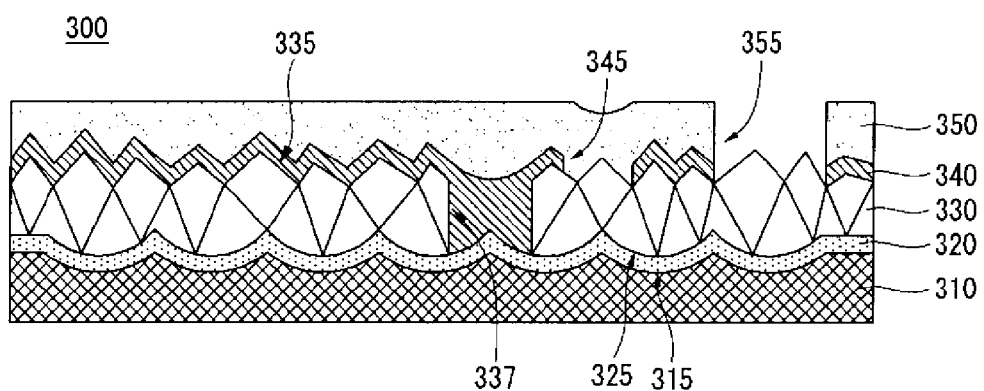
FIG. 4 is a diagram illustrating a thin film solar cell according to a second embodiment of this document.

FIG. 4 is a diagram illustrating a thin film solar cell according to a second embodiment of this document.

Referring to FIG. 4, the thin film solar cell 300 comprises a substrate 310 having a plurality of first unevenness 315, an inorganic layer 320 which is disposed on the substrate 310 and has a plurality of second unevenness 325, a first electrode 330 which is disposed on the inorganic layer 320 and has a plurality of third unevenness 335, an absorbing layer 340 disposed on the first electrode 330, and a second electrode 350 disposed on the absorbing layer 340.

The substrate 310 may employ glass or transparent resin film. The glass may be plate glass having, as main compositions, silicon oxide ($SiO_2$), sodium oxide ($Na_2O$), and calcium oxide (CaO) with high transparency and insulating property.

The substrate 310 is positioned at the lowermost part, and may play a part to cause a plurality of second unevenness 325 and third unevenness 335 to be formed on the inorganic layer 320 and the first electrode 330 disposed on the substrate 310, respectively.

A sectional shape of the first unevenness 315 may be a hemisphere as shown in the figure. When the inorganic layer 320 is deposited later, the first unevenness 315 facilitates the formation of the second unevenness 325 on the inorganic layer 320 since the inorganic layer 320 is formed following the step coverage of the substrate 310 having the first unevenness 315. However, the sectional shape of the first unevenness 315 is not limited to the hemisphere but may be a polygon of a triangle or more.

The inorganic layer 320 is an insulating layer having a plurality of second unevenness 325 and may be made of silicon nitride (SiNx). The second unevenness 325 of the inorganic layer 320 is formed following the step coverage of the substrate 310 having a plurality of first unevenness 315, and thus may have the same shape as the first unevenness 315.

In addition, the inorganic layer 320 may have the thickness of 3000 to 6000Å in the same manner as the above-described first embodiment.

The first electrode 330 may be made of a material which is the same as the material in the above-described first embodiment. The first electrode 330 may be formed of a single layer made of the transparent conductive oxide or the metal, but not limited thereto, it may be formed of multiple layers of double layers of the transparent conductive oxide and the metal, or more.

The surface of the first electrode 330 is provided with a plurality of third unevenness 335. The third unevenness 335 increases the surface area of the first electrode 330 and thus has an advantage in that scattering of incident light is generated to lengthen the path of the light.

The absorbing layer 340 may be made of a material which is the same as the material in the first embodiment. In addition, the second electrode 350 may be made of a material which is the same as the material in the first embodiment.

Hereinafter, a method of manufacturing the thin film solar cell according to the second embodiment of this document will be described.

FIGS. 5A to 5E are diagrams illustrating a method of manufacturing the thin film solar cell according to the second embodiment of this document, in an order of processes. In the following, the description overlapped with the above description will be omitted.

Figure 5A:
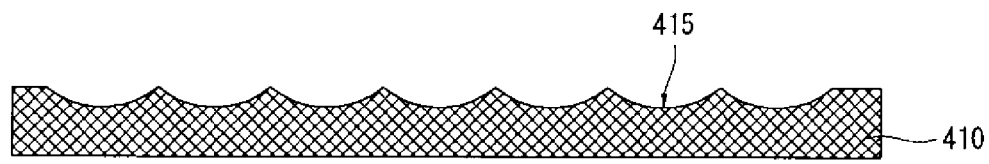
FIGS. 5A to 5E are diagrams illustrating a method of manufacturing the thin film solar cell according to the second embodiment of this document, in an order of processes.

Referring to FIG. 5A, first, a surface of a substrate 410 is etched to form a plurality of first unevenness 415. Here, the first unevenness 415 may be formed using a wet etching or a dry etching. At this time, the depth of the first unevenness 415 is adjusted so as not to reduce the durability of the substrate 410.

Figure 5B:
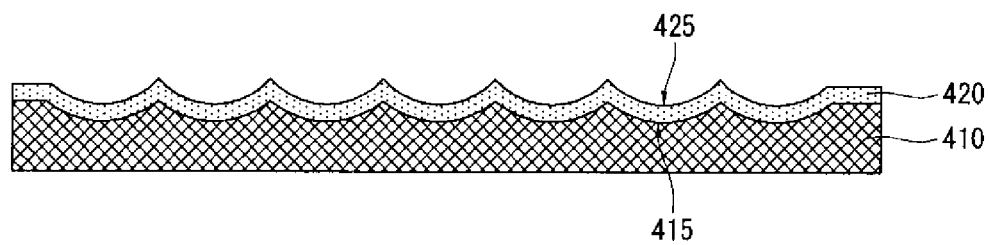

In FIG. 5B, an inorganic layer 420 is deposited on the substrate 410 having the first unevenness 415. As described above, the inorganic layer 420 may be formed by depositing silicon nitride (SiNx) using the chemical vapor deposition (CVD). At this time, the inorganic layer 420 has the thickness of 3000 to 6000Å.

Thereby, the inorganic layer 420 is formed following the step coverage of the substrate 410 having the first unevenness 415, and thus a plurality of second unevenness 425 is formed on the inorganic layer 420.

Figure 5C:
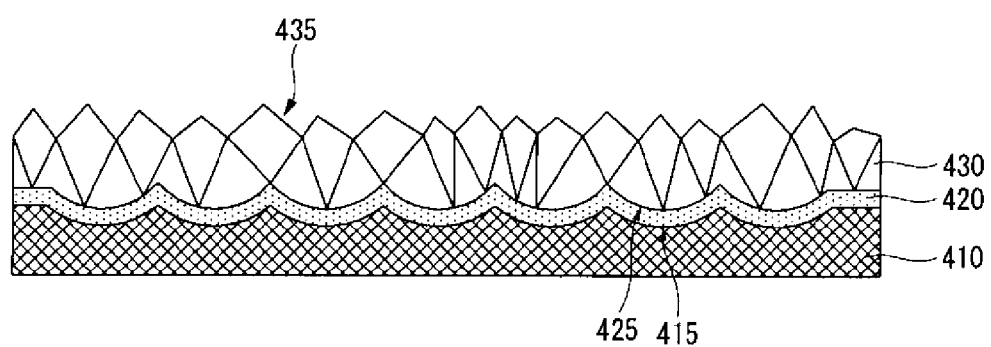

Next, in FIG. 5C, a first electrode 430 is formed on the substrate 410 provided with the second unevenness 425.

Specifically, if a transparent conductive material, for example, ITO is deposited on the inorganic layer 420 using a sputtering method, the crystallinity of the ITO is improved due to the underlying second unevenness 425 and undergoes the self-textured step during the deposition. Therefore, the third unevenness 435 is formed on the surface of the first electrode 430 resulting from the self-textured step of the first electrode 430.

The third unevenness 435 may have an irregularly protruding shape, and the height of each of the third unevenness 435 may be a random height.

Figure 5D:
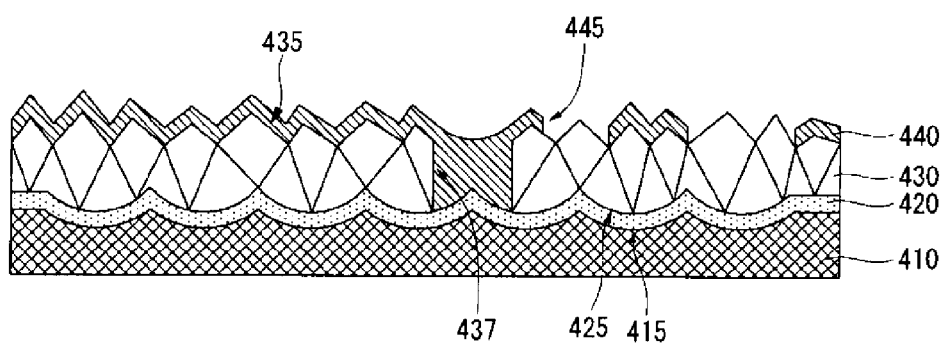

In FIG. 5D, the first electrode 430 is patterned to form a first patterned line 437 such that the first electrode 430 is divided into each other.

Subsequently, an absorbing layer 440 is formed and patterned on the first electrode 430 where the patterning is completed, thereby forming a second patterned line 445 such that the absorbing layer 440 is divided into each other.

Figure 5E:
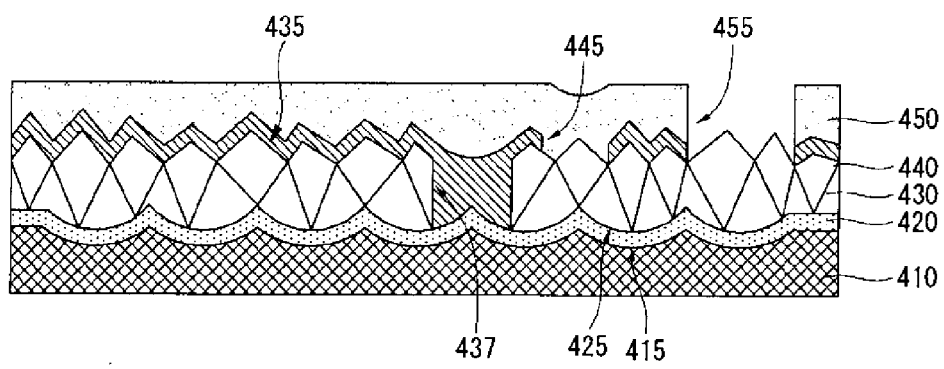

Next, in FIG. 5E, a second electrode 450 is formed on the substrate 410 provided with the absorbing layer 440 where the patterning is completed. The second electrode 450 may be made of a material which is the same as the material of the first electrode 430. For electrical insulation, the absorbing layer 440 and the second electrode 450 formed on the substrate 410 are patterned. At this time, a region spaced apart from the above-described first patterned line 437 and second patterned line 445 is patterned, which may be thus electrically insulated by a third patterned line 455.

As described above, the thin film solar cell according to the second embodiment of this document can be manufactured.

As such, the second embodiment has an advantage in that since the substrate, which is positioned under the first electrode and has a plurality of first unevenness, is formed, a plurality of third unevenness can be formed on the surface of the first electrode deposited on the substrate and the inorganic layer. Therefore, this can replace the process where the unevenness is formed on the first electrode using the acid-base solution in the related art.

Thereby, there is advantageous in that it is possible to easily form the unevenness on the surface of the first electrode and to prevent deterioration in the electrical characteristics due to the damage of the surface of the first electrode.

An Embodiment is described for easy understanding of the present invention. However, the following Embodiment is only an example of the present invention, and the present invention is not limited to the Embodiment.

Embodiment

A silicon nitride with the thickness of 3000□ was formed on a glass substrate, and a plurality of unevenness is formed on the silicon nitride using the wet etching. In addition, zinc oxide doped with gallium is sputtered on the silicon nitride to form a first electrode with the thickness of 1000Å.

Comparative Example

The first electrode was formed under the same process condition as the above-described Embodiment, without the formation of the unevenness on the silicon nitride.

Figure 6:
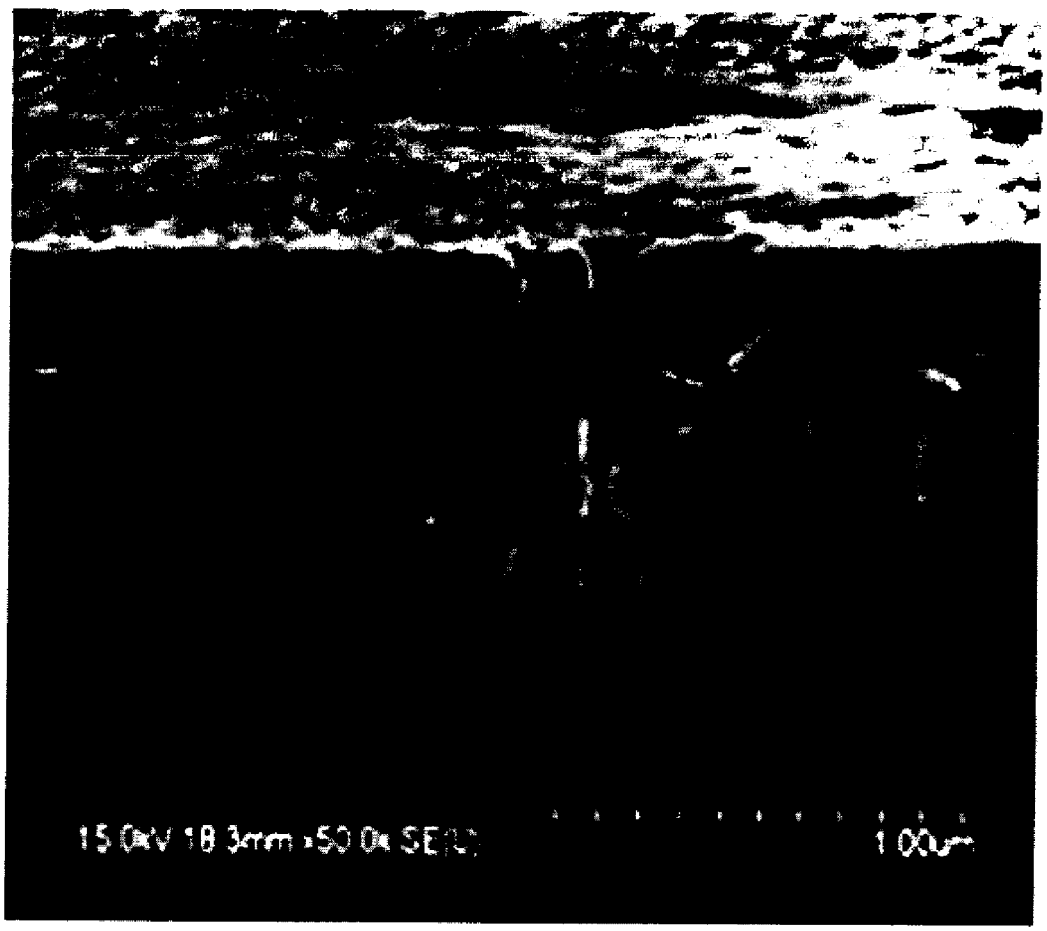
FIG. 6 is an SEM picture photographing a section of a first electrode which is formed according to a comparative example.
Figure 7:
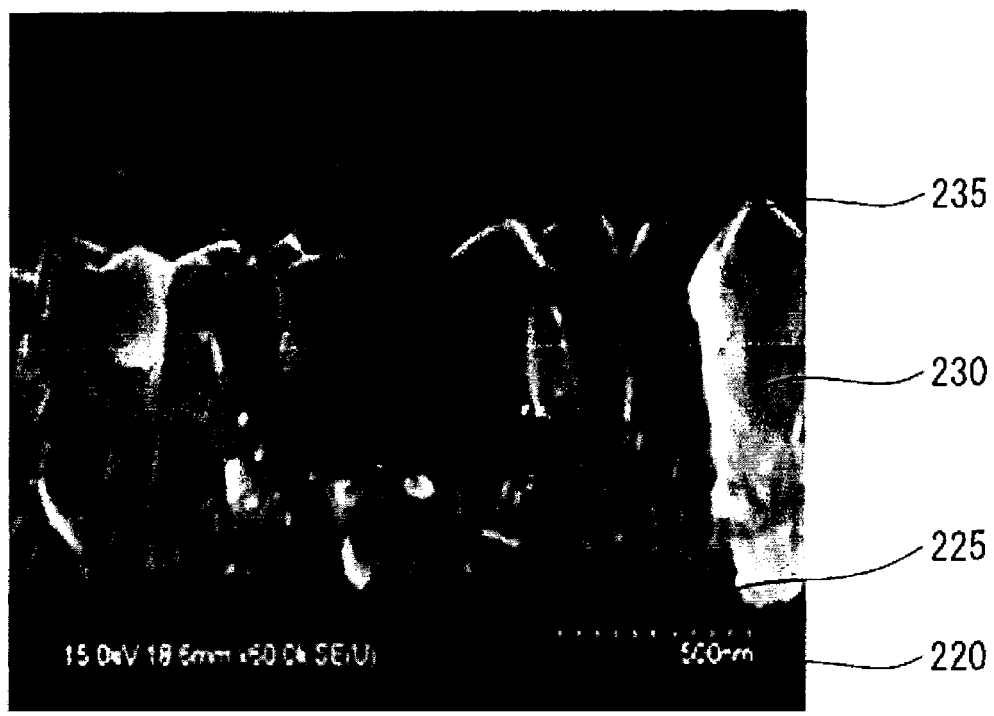
FIGS. 7 and 8 are SEM pictures photographing a section and a surface of the first electrode which is formed according to the Embodiment.

FIG. 6 is an SEM picture photographing a section of a first electrode which is formed according to a comparative example of related art, and FIGS. 6 and 7 are SEM pictures photographing a section and a surface of the first electrode which is formed according to the embodiments of this document.

Figure 8:

In FIGS. 6 to 8, it can be seen that the surface of the first electrode formed according to the comparative example is even, but the surface of the first electrode formed according to the Embodiment has a plurality of unevenness.

As such, in the thin film solar cell and the manufacturing method thereof according to this document, by forming the unevenness on the substrate or the inorganic layer positioned under the first electrode, the unevenness can be formed on the first electrode without directly forming the unevenness on the surface of the first electrode.

Therefore, there is advantageous in that it is possible to easily form the unevenness on the surface of the first electrode and to prevent damage of the surface of the first electrode, thereby improving the electrode characteristics of the thin film solar cell.

Figure 9:
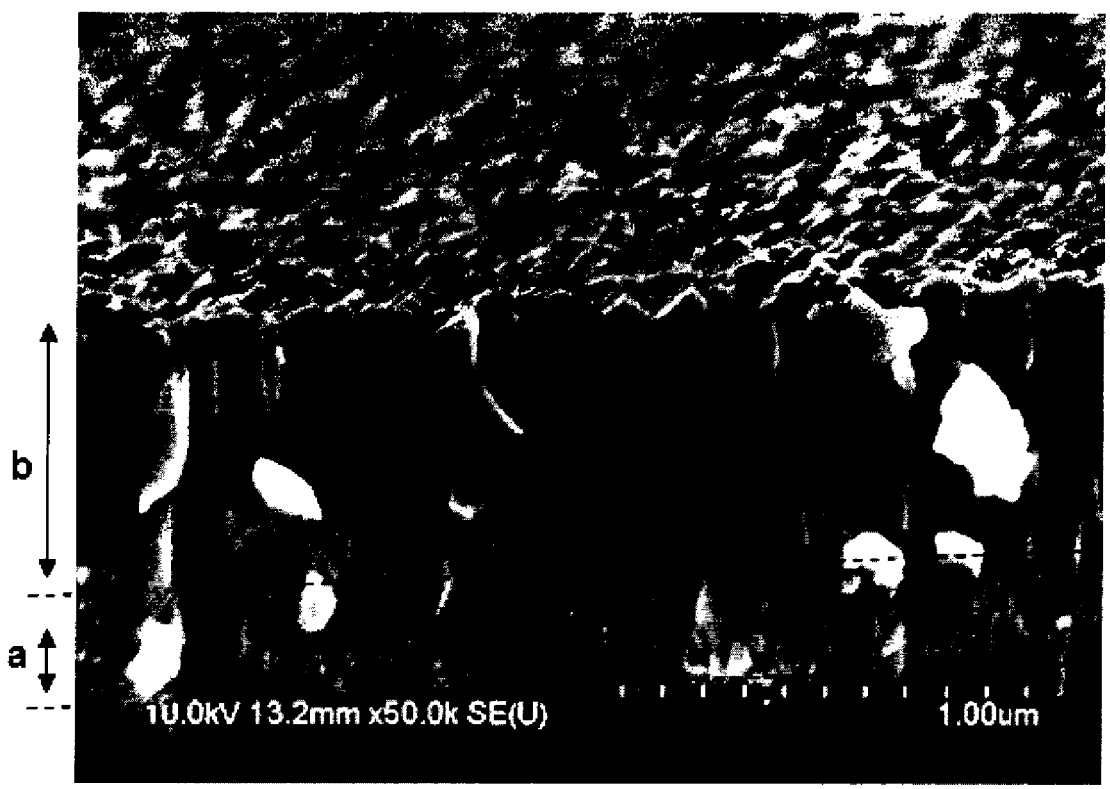
FIG. 9 is an SEM picture photographing a section and a surface of the first electrode when unevenness formed in the inorganic layer is shallow.
Figure 10:
FIG. 10 is an SEM picture photographing a section and a surface of the first electrode when unevenness formed in the inorganic layer is deep.
Figure 11:
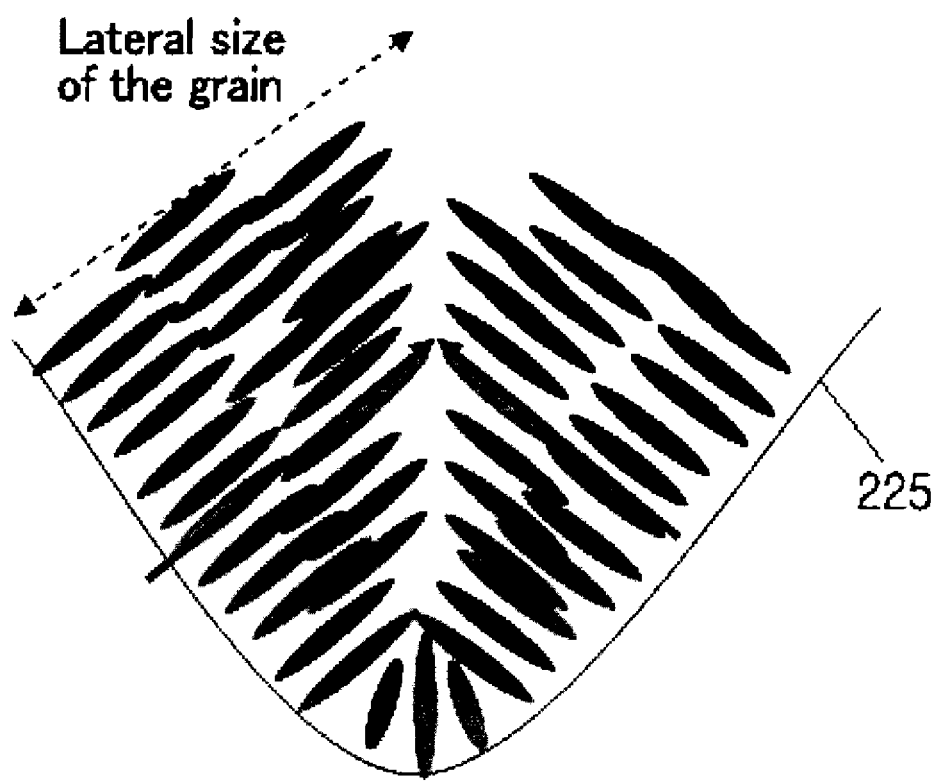
FIG. 11 is a diagram illustrating a growth direction of grains in a groove of the inorganic layer.

FIGS. 9 to 11 are diagrams illustrating crystal structures of the first electrode 230 which vary depending on a patterning degree of the inorganic layer 220.

As shown in FIG. 9, when the inorganic layer 220 is not patterned, or the inorganic layer 220 is nearly smooth since the inorganic layer 220 is not patterned at a desired depth, a first electrode material is deposited on the inorganic layer 220, and this leads to forming a seed layer having very small grains like a part a. In this case, the grains are more grown in the vertical direction than in the horizontal direction, and the continuous growth causes the volume to increase with a columnar structure. Therefore, the size of facet formed in a part b on the seed layer in the first electrode 230 is relatively small. Planes of the facet are mainly generated under an atmosphere where a growth speed of lateral sides is superior.

Like a case shown in FIG. 10, when the inorganic layer 220 is patterned well at desired depth and shape, it can be confirmed that the growth direction of the seed layer in the part a is different from that shown in FIG. 9. The fine grains of the seed layer are grown in the diagonal direction towards the center of the groove of the inorganic layer 220 as shown in FIG. 11, in the initial state of the deposition of the first electrode 230, and then meet in the center of the groove, thereby being restricted in a c-axial growth. From this time, the grains are grown in the lateral side direction in terms of a crystal structure sunce the horizontal growth is superior, and, in turn, the size of the grains becomes greater such that the size of the facet greatly increases.

Since the thickness of the first electrode 230 is limited, if the size of the groove is too large, the groove may not be filled before the unevenness of the first electrode surface is obtained. Also, as can be from FIG. 11, if the size of the groove of the inorganic layer 220 is too small, the lateral side growth of the grains may not be sufficiently made. The size of the facet can be adjusted to be larger by increasing a deposition time of the first electrode material and heightening a deposition temperature of the first electrode material.

As described above, in the thin film solar cell and the manufacturing method thereof according to this document, by forming the unevenness on the substrate or the inorganic layer positioned under the first electrode, the unevenness can be formed on the first electrode without directly forming the unevenness on the surface of the first electrode. As a result, it is possible to easily form the unevenness on the surface of the first electrode and to prevent damage of the surface of the first electrode, thereby improving the electrode characteristics of the thin film solar cell.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A thin film solar cell comprising:
   a substrate;
   an inorganic insulating layer disposed on the substrate and having a plurality of first unevenness on an etched surface that includes a plurality of grooves, and a substantially flat surface opposite to the etched surface;

a first electrode disposed on the inorganic insulating layer and having a plurality of second unevenness, wherein the grooves of the inorganic insulating layer are entirely filled with the first electrode, and wherein a size including a depth of the plurality of grooves of the inorganic insulating layer and a thickness of the first electrode are such that the plurality of second unevenness are self-textured by a crystallinity of the first electrode that is in a substantially diagonal direction within the grooves and in a substantially lateral side direction in terms of a crystal structure above the grooves, and that a frequency of peaks of the self-textured second unevenness is greater than that of the first unevenness;

an absorbing layer disposed on the first electrode; and a second electrode disposed on the absorbing layer.

2. The thin film solar cell of claim 1, wherein a sectional shape of the first unevenness is a hemisphere.

3. The thin film solar cell of claim 1, wherein the inorganic insulating layer is made of silicon nitride.

4. The thin film solar cell of claim 1, wherein the inorganic insulating layer has a thickness of 3000 to 6000 Å.

5. The thin film solar cell of claim 1, wherein the second unevenness has an irregularly protruding shape.

* * * * *